(12) United States Patent
Koike et al.

(10) Patent No.: US 11,742,454 B2
(45) Date of Patent: Aug. 29, 2023

(54) METHOD FOR MANUFACTURING CONCENTRATOR PHOTOVOLTAIC MODULE, AND TRANSPORT JIG

(71) Applicant: SUMITOMO ELECTRIC INDUSTRIES, LTD., Osaka (JP)

(72) Inventors: Yukio Koike, Osaka (JP); Kenji Saito, Osaka (JP); Ryusuke Imai, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 58 days.

(21) Appl. No.: 16/976,928

(22) PCT Filed: Feb. 21, 2019

(86) PCT No.: PCT/JP2019/006479
§ 371 (c)(1),
(2) Date: Aug. 31, 2020

(87) PCT Pub. No.: WO2019/171966
PCT Pub. Date: Sep. 12, 2019

(65) Prior Publication Data
US 2021/0013364 A1 Jan. 14, 2021

(30) Foreign Application Priority Data

Mar. 5, 2018 (JP) ................................. 2018-038644

(51) Int. Cl.
*H01L 31/18* (2006.01)
*H01L 31/054* (2014.01)
*H02S 30/10* (2014.01)

(52) U.S. Cl.
CPC ...... *H01L 31/1876* (2013.01); *H01L 31/0543* (2014.12); *H02S 30/10* (2014.12)

(58) Field of Classification Search
CPC .................................................. H01L 31/0543
See application file for complete search history.

(56) References Cited

U.S. PATENT DOCUMENTS

| 4,228,791 | A  | * | 10/1980 | Hirai ..................... F24S 80/30 52/460 |
| 5,993,582 | A  | * | 11/1999 | Yoshino ................ H01L 31/048 156/104 |
| 6,453,629 | B1 | * | 9/2002  | Nakazima ............... F24S 40/44 52/173.3 |
| 2002/0127092 | A1 | * | 9/2002 | Shirasaki ......... G01N 21/95692 414/751.1 |

(Continued)

FOREIGN PATENT DOCUMENTS

| EP | 3306676 A1 | 4/2018 |
| EP | 3496161 A1 | 6/2019 |

(Continued)

*Primary Examiner* — Sadie White
(74) *Attorney, Agent, or Firm* — Oliff PLC

(57) ABSTRACT

A method for manufacturing a concentrator photovoltaic module including: power generating elements whereon sunlight is concentrated by condenser lenses; and a housing accommodating the power generating elements. The housing includes a resin frame body, a metal bottom plate closing a bottom-side opening of the frame body and an inner surface wherein power generating elements are disposed. The method includes: a peripheral edge of the inner surface of the bottom plate connected to a bottom end surface of the frame body, fixing the bottom plate to the frame body creating the housing; and fixing the housing to a transport jig for transporting the housing horizontally. The transport jig includes a support portion corresponding to the bottom end surface of the frame body, and supports the housing. The housing is fixed to the transport jig, with the support portion attached to a peripheral edge of an outer surface of the bottom plate.

3 Claims, 9 Drawing Sheets

(56) References Cited

U.S. PATENT DOCUMENTS

| | | | |
|---|---|---|---|
| 2005/0081909 A1* | 4/2005 | Paull | G02B 19/0028 |
| | | | 136/246 |
| 2009/0000662 A1* | 1/2009 | Harwood | H01L 31/0504 |
| | | | 136/259 |
| 2009/0133737 A1* | 5/2009 | Anzawa | H02S 20/32 |
| | | | 136/246 |
| 2010/0236603 A1 | 9/2010 | Menard et al. | |
| 2011/0108113 A1* | 5/2011 | Arikawa | H01L 31/044 |
| | | | 136/259 |
| 2012/0037206 A1 | 2/2012 | Norman et al. | |
| 2012/0152877 A1* | 6/2012 | Tadayon | B25J 5/005 |
| | | | 901/30 |
| 2013/0146120 A1 | 6/2013 | Seel et al. | |
| 2013/0240466 A1* | 9/2013 | Sponseller | H02S 20/23 |
| | | | 211/26 |
| 2014/0295611 A1* | 10/2014 | Schmid | H01L 21/67706 |
| | | | 438/69 |
| 2014/0360552 A1* | 12/2014 | Britcher | B65D 19/44 |
| | | | 211/85.8 |
| 2018/0234046 A1 | 8/2018 | Saito et al. | |

FOREIGN PATENT DOCUMENTS

| | | |
|---|---|---|
| JP | 2010-109090 A | 5/2010 |
| JP | 2011-051609 A | 3/2011 |
| JP | 2013-084670 A | 5/2013 |
| JP | 2013-129444 A | 7/2013 |
| JP | 2015-142096 A | 8/2015 |
| JP | 2017-022838 A | 1/2017 |
| WO | 2011/060467 A1 | 5/2011 |
| WO | 2016/189895 A1 | 12/2016 |
| WO | 2018/025589 A1 | 2/2018 |

* cited by examiner

METHOD FOR MANUFACTURING CONCENTRATOR PHOTOVOLTAIC MODULE, AND TRANSPORT JIG

TECHNICAL FIELD

The present invention relates to a method for manufacturing a concentrator photovoltaic module, and a transport jig.

This application claims priority on Japanese Patent Application No. 2018-038644 filed on Mar. 5, 2018, the entire content of which is incorporated herein by reference.

BACKGROUND ART

A unit serving as an optical base unit in a concentrator photovoltaic apparatus includes: for example, a primary condenser lens being a convex lens, a secondary condenser lens being a spherical lens, and a power generating element (see PATENT LITERATURE 1 (FIG. 8), for example). As the power generating element, a solar cell formed by a compound semiconductor element having high power generation efficiency is used. Sunlight is concentrated by the primary condenser lens to be incident on the secondary condenser lens, and then, is further concentrated by the secondary condenser lens to reach the power generating element.

A large number of such concentrator photovoltaic units are arranged in a matrix to form a concentrator photovoltaic module, and then, a large number of such modules are arranged in a matrix to form a concentrator photovoltaic panel. The concentrator photovoltaic panel forms a concentrator photovoltaic apparatus, together with a driving device for causing the panel to perform tracking operation while facing the sun.

In the concentrator photovoltaic module mentioned above, a bottom plate of a housing has a large number of power generating elements mounted at the surface thereof. As a material of this bottom plate, a metal plate (e.g., an aluminum plate or the like) having a small plate thickness is sometimes used from the viewpoint of suppressing production cost and ensuring heat dissipation performance. A frame body forming an outer frame of the housing supports an outer edge portion of the bottom plate. As a material of this frame body, a resin material is sometimes used to suppress production cost.

CITATION LIST

Patent Literature

PATENT LITERATURE 1: US Patent Application Publication No. US2010/0236603A1

SUMMARY OF INVENTION (1) A method according to one embodiment is a method for manufacturing a concentrator photovoltaic module including: a plurality of power generating elements onto which sunlight is concentrated by a plurality of condenser lenses; and a housing configured to accommodate the plurality of power generating elements. The housing includes a resin frame body, and a metal bottom plate that closes a bottom-side opening of the frame body and has an inner surface on which the plurality of power generating elements are disposed. The method includes: a first step of bringing a peripheral edge of the inner surface of the bottom plate into contact with a bottom end surface of the frame body, and fixing the bottom plate to the frame body to obtain the housing; and a second step of fixing the housing to a transport jig configured to transport the housing in a horizontally laid state. The transport jig includes a support portion that is provided so as to correspond to the bottom end surface of the frame body, and supports the housing from below. In the second step, the housing is fixed to the transport jig, with the support portion being in contact with a peripheral edge of an outer surface of the bottom plate.

A transport jig according to another embodiment is a transport jig configured to transport a housing for a photovoltaic module, and the housing accommodates a plurality of power generating elements onto which sunlight is concentrated by a plurality of condenser lenses. The housing includes a resin frame body, and a metal bottom plate that closes a bottom-side opening of the frame body and has an inner surface on which the plurality of power generating elements are disposed. The bottom plate is fixed to the frame body, with a peripheral edge of the inner surface of the bottom plate being in contact with the bottom end surface of the frame body. The transport jig includes a support portion that is provided so as to correspond to the bottom end surface of the frame body and supports the housing from below while being in contact with an peripheral edge of an outer surface of the bottom plate. The transport jig transports the housing in a horizontally laid state.

DESCRIPTION OF EMBODIMENTS

Figure 1:
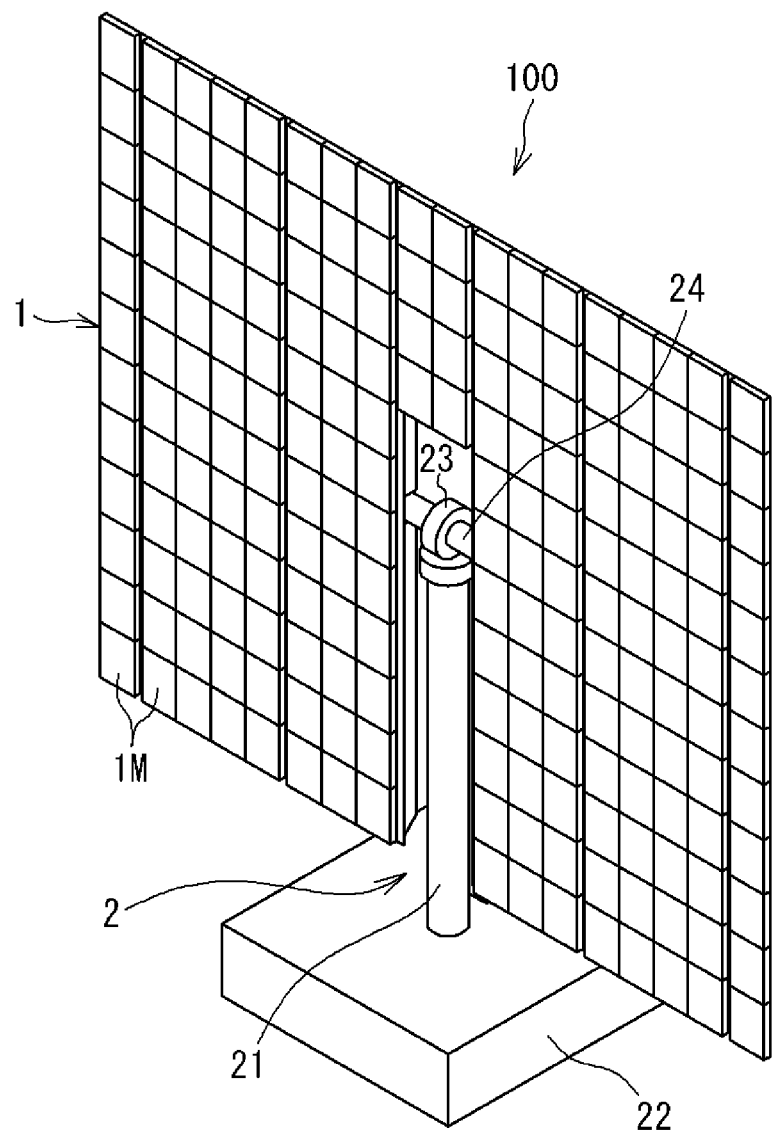
FIG. 1 is a perspective view showing one example of a concentrator photovoltaic apparatus.

Problems to be Solved by the Present Disclosure

In a case where the frame body forming the housing of the concentrator photovoltaic module is formed from a resin material, rigidity of the housing is relatively low because of the resin frame body, which may cause deflection of the housing during assembling of the concentrator photovoltaic module or transportation between process steps.

Such deflection of the housing during assembling or transportation adversely affects a product tolerance and/or performance as a module, and therefore, is desired to be suppressed as much as possible.

The present disclosure has been made in view of the above circumstances, and an object of the present disclosure is to provide a technology for suppressing deflection of a housing during assembling or transportation.

Effects of the Present Disclosure

According to the present disclosure, deflection that occurs in a housing during assembling or transportation can be suppressed.

First, contents of embodiments of the present disclosure are listed and described.

Description of Embodiment of the Present Disclosure (1) A method according to one embodiment is a method for manufacturing a concentrator photovoltaic module including: a plurality of power generating elements onto which sunlight is concentrated by a plurality of condenser lenses; and a housing configured to accommodate the plurality of power generating elements. The housing includes a resin frame body, and a metal bottom plate that closes a bottom-side opening of the frame body and has an inner surface on which the plurality of power generating elements are disposed. The method includes: a first step of bringing a peripheral edge of the inner surface of the bottom plate into contact with a bottom end surface of the frame body, and fixing the bottom plate to the frame body to obtain the housing; and a second step of fixing the housing to a transport jig configured to transport the housing in a horizontally laid state. The transport jig includes a support portion that is provided so as to correspond to the bottom end surface of the frame body, and supports the housing from below. In the second step, the housing is fixed to the transport jig, with the support portion being in contact with a peripheral edge of an outer surface of the bottom plate.

According to the method for manufacturing the photovoltaic module of the above configuration, since the housing is fixed to the transport jig while the support portion provided so as to correspond to the bottom end surface of the frame body is in contact with the peripheral edge of the outer surface of the bottom plate, the housing can be supported by the transport jig without deflection of the resin frame body. Therefore, when the housing fixed to the transport jig is subjected to the subsequent work process, it is possible to suppress deflection that occurs in the housing during assembling and transportation between process steps.

(2) In the above method for manufacturing the photovoltaic module, in the first step, preferably, the bottom plate is adhesively fixed to the frame body. In the second step, preferably, the housing is fixed to the transport jig by means of a fixing member such that the support portion and the bottom plate are held between the fixing member and the bottom end surface of the frame body.

In this case, the fixing member presses the support portion toward the bottom plate while preventing the bottom plate and the frame body from being relatively displaced, whereby the bottom plate and the frame body can be closely adhered to each other. As a result, the bottom plate and the frame body can be appropriately adhered to each other, and the housing fixed to the transport jig can be transported to the next work process with the bottom plate and the frame body being adhered to each other.

(3) In the above method for manufacturing the concentrator photovoltaic module, preferably, the fixing member is a tapping screw that penetrates through the support portion and the bottom plate and is screwed into a hole formed at the bottom end surface of the frame body.

In this case, since the frame body is formed from resin, if a hole is formed in the frame body, the fixing member can be screwed into the hole, whereby the housing can be easily fixed to the transport jig.

Since the fixing member can be screwed into the hole from the outside of the housing, fixing and removal of the housing to and from the transport jig are facilitated.

The transport jig and the fixing member removed from the housing are reusable.

(4) In the above method for manufacturing the concentrator photovoltaic module, an output code connected to the plurality of power generating elements is provided on the outer surface of the bottom plate. In the second step, the housing may be fixed to the transport jig, with the output code being released to the outside of the support portion through a gap formed in the support portion to release the output code to the outside of the support portion.

In this case, output inspection for the photovoltaic module can be performed with the housing being fixed to the transport jig.

(5) In the above method for manufacturing the concentrator photovoltaic module, on the outer surface of the bottom plate, a code holder for holding the output code is provided so as to correspond to the gap. In the second step, the housing may be fixed to the transport jig, with the output code being released to the outside of the support portion through the gap formed in the support portion to release the output code to the outside of the support portion, and with the output code being held by the code holder while being released to the outside of the support portion.

In this case, the housing can be easily fixed to the transport jig, with the output code being released to the outside of the support portion.

(6) A transport jig according to another embodiment is a transport jig configured to transport a housing for a concentrator photovoltaic module, and the housing accommodates a plurality of power generating elements onto which sunlight is concentrated by a plurality of condenser lenses. The housing includes a resin frame body, and a metal bottom plate that closes a bottom-side opening of the frame body and has an inner surface on which the plurality of power generating elements are disposed. The bottom plate is fixed to the frame body, with a peripheral edge of the inner surface of the bottom plate being in contact with the bottom end surface of the frame body. The transport jig includes a support portion that is provided so as to correspond to the bottom end surface of the frame body and supports the housing from below while being in contact with an peripheral edge of an outer surface of the bottom plate. The transport jig transports the housing in a horizontally laid state.

According to the transport jig of the above configuration, since the housing is transported to the subsequent work process while being fixed to the transport jig, deflection that occurs in the housing during assembling and transportation between process steps can be suppressed.

(7) The above transport jig may further include a handle for handling the transport jig.

In this case, the transport jig can be moved without directly touching the bottom plate and the frame body adhered to each other.

(8) Preferably, the above transport jig further includes ball rollers that are in contact with a floor surface where the transport jig is placed, and allow the transport jig to travel freely.

In this case, transportation of the housing fixed to the transport jig is facilitated.

(9) Preferably, the above transport jig further includes: a rectangular frame-shaped body part on which the support portion is provided; and a bottom plate holding portion that is provided so as to cross the inside of the frame-shaped body part, and holds the bottom plate from below.

In this case, while the housing is fixed to the transport jig and transported between process steps, the bottom plate is held by the holding member so as not to deflect downward. This improves workability when the bottom plate is subjected to the respective process steps in the work process.

Description of Embodiments

Hereinafter, preferred embodiments will be described with reference to the drawings.

At least some parts of the embodiments described below may be combined together as desired.

Photovoltaic Apparatus and Photovoltaic Module

FIG. 1 is a perspective view showing one example of a concentrator photovoltaic apparatus.

In FIG. 1, this photovoltaic apparatus 100 includes: an array (the entire photovoltaic panel) 1 having a shape that is continuous on the upper side and is divided into left and right portions on the lower side; and a support device 2 for supporting the array 1. The array 1 is formed by a plurality of modules 1M being arrayed. In the example shown in FIG. 1, the array 1 is configured as an assembly composed of 200 modules 1M in total, i.e., 192 (96(=12×8)×2) modules forming the left and right wings and 8 modules forming the connection portion at the center.

The support device 2 includes a post 21, a base 22, a biaxial drive part 23, and a horizontal shaft 24 serving as a drive shaft. The lower end of the post 21 is fixed to the base 22, and the upper end of the post 21 is provided with the biaxial drive part 23.

In FIG. 1, the post 21 is parallel to the vertical direction, and the horizontal shaft 24 is parallel to the horizontal direction. The biaxial drive part 23 can rotate the horizontal shaft 24 in two directions of azimuth (angle around the post 21 as the center axis) and elevation (angle around the horizontal shaft 24 as the center axis).

FIG. 1 shows the support device 2 that supports the array 1 by the single post 21. However, the configuration of the support device 2 is not limited thereto. That is, any support device that can support the array 1 so as to be movable in two axes (azimuth, elevation) can be employed.

Figure 2:
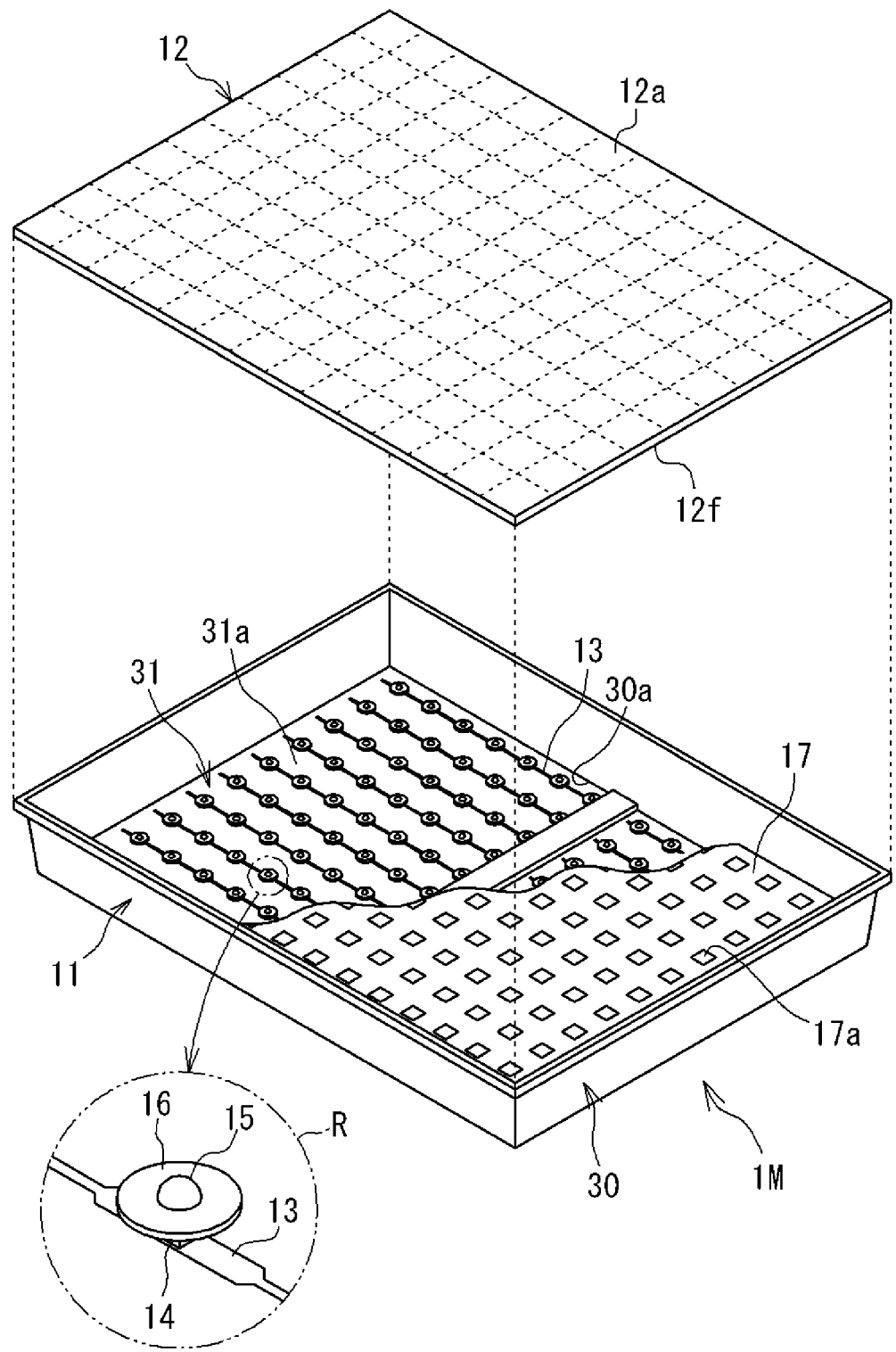
FIG. 2 is a perspective view showing one example of a module configuration.

FIG. 2 is a perspective view showing one example of a configuration of the module 1M. In FIG. 2, in terms of the physical form in appearance, the module 1M includes: a housing 11 made of metal and having a rectangular flat-bottomed container shape; and a concentrating portion 12 mounted, like a cover, to the housing 11, for example. The concentrating portion 12 is formed by attaching resin condenser lenses 12f to the back face of a single transparent glass plate 12a, for example. For example, each of square (10×14) sections shown in FIG. 2 is a Fresnel lens serving as a condenser lens 12f, and can cause sunlight to be converged at the focal point.

The housing 11 includes a frame body 30 formed from resin, and a bottom plate 31 closing a bottom-side opening 30a of the frame body.

The frame body 30 is formed in a rectangular cylindrical shape by use of a resin material such as PBT (Poly Butylene Terephtalate) resin loaded with glass fibers, for example.

The bottom plate 31 is a plate-shaped member formed from an aluminum alloy, for example.

A flexible printed circuit 13 is disposed on an inner surface 31a of the bottom plate 31. Cell packages 14 each holding a cell (power generating element) are mounted at predetermined positions on the flexible printed circuit 13.

In FIG. 2, the portion surrounded by a "o" (circle) depicted by a chain double-dashed line is an enlarged figure of a light receiving portion R. In the light receiving portion R, a secondary lens 15 is provided on the cell package 14, and a protection plate 16 is provided around the secondary lens. The secondary lens 15 is a ball lens, for example. The protection plate 16 is an annular shaped metal body, for example, and a commercially available washer can be used. When converged sunlight deviates from the secondary lens 15, the protection plate 16 prevents the converged light from causing thermal damage to the periphery of the cell. Even when all the converged light enters the secondary lens 15, the protection plate 16 receives scattered light in the housing 11 and reflects the scattered light.

The light receiving portions R are provided so as to respectively correspond to the condenser lenses 12f by the same number and at the same interval. Therefore, sunlight is concentrated on each light receiving portion R by the condenser lens 12f.

A shielding plate 17 is provided between the light receiving portion R and the concentrating portion 12. In the shielding plate 17, at positions corresponding to the individual condenser lenses 12f, openings 17a each corresponding to one condenser lens 12f are formed. Sunlight converged by the condenser lens 12f passes through the opening 17a. When the incident direction of sunlight is greatly deviated from the optical axis of the light receiving portion R, the light that will be concentrated to a deviated position hits the shielding plate 17.

Process of Assembling Photovoltaic Module

Figure 3:
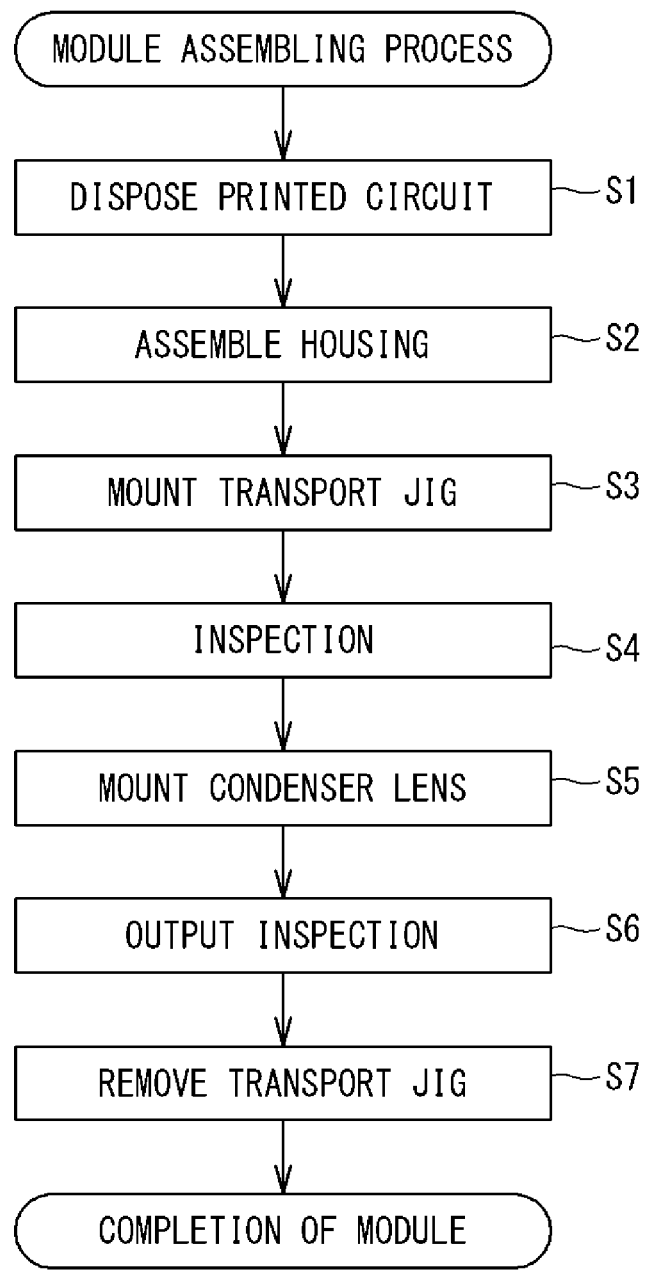
FIG. 3 shows a process of assembling a photovoltaic module.

FIG. 3 shows one example of a process of assembling the aforementioned photovoltaic module 1M.

In order to assemble the photovoltaic module 1M, first, the flexible printed circuit 13 is disposed on the inner surface 31a of the bottom plate 31 (step S1).

Next, the housing 11 is assembled (step S2), and thus obtained housing 11 is mounted and fixed to a transport jig (step S3).

Figure 4:
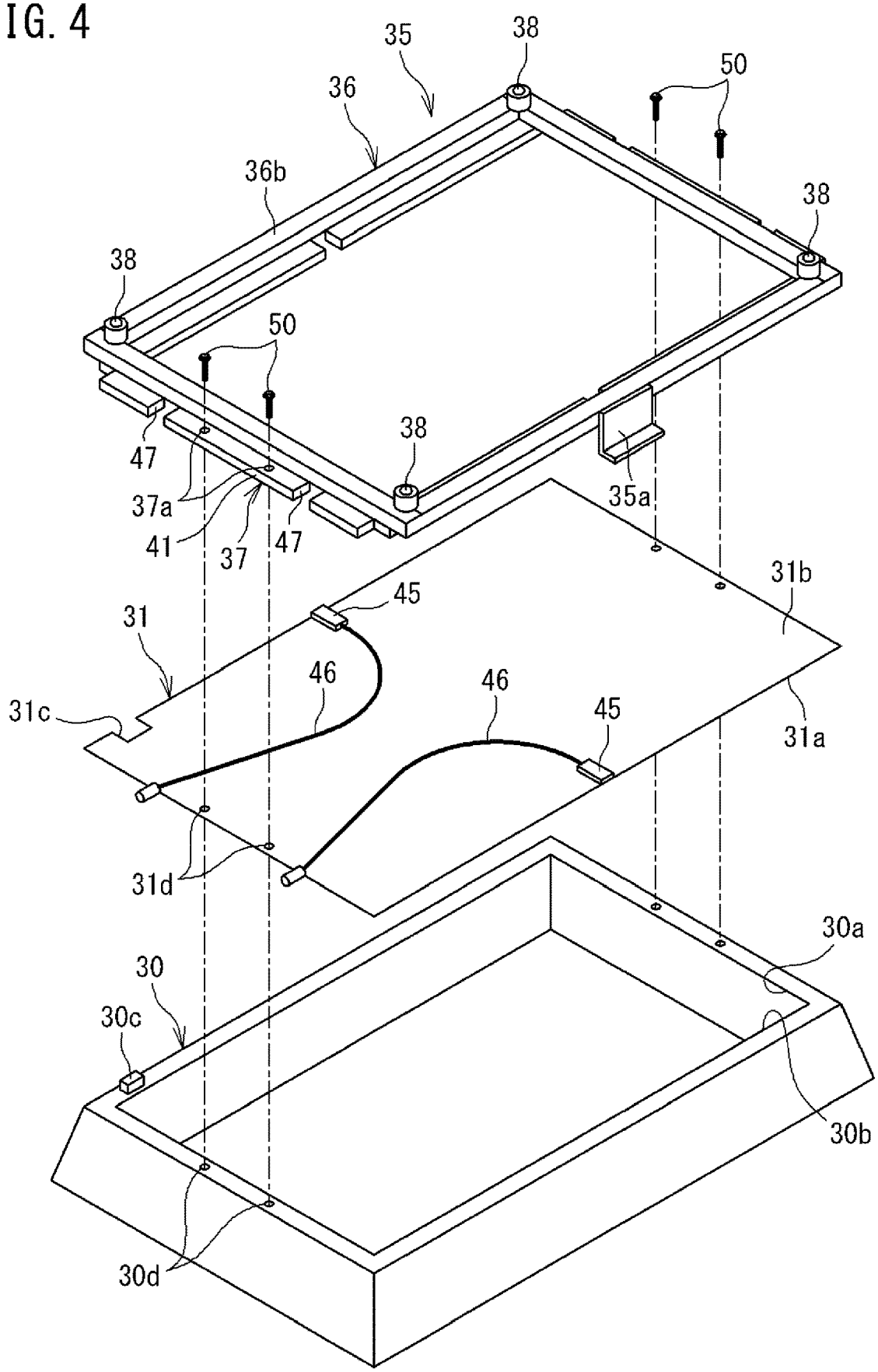
FIG. 4 is an exploded perspective view showing a frame body, a bottom plate, and a transport jig 35.

FIG. 4 is an exploded perspective view showing the frame body 30, the bottom plate 31, and the transport jig 35. In FIG. 4, the frame body 30 is shown upside down such that an outer surface 31b of the bottom plate 31 faces upward with respect to the surface of the sheet.

In assembling the housing 11 in step S2, the peripheral edge of the inner surface 31a of the bottom plate 31 is brought into contact with a bottom end surface 30b of the frame body 30, thereby fixing the bottom plate 31 to the frame body 30. At this time, a caulking agent as an adhesive agent is applied to the peripheral edge of the inner surface 31a of the bottom plate 31 and to the bottom end surface 30b, and thereafter, the peripheral edge of the inner surface 31a of the bottom plate 31 is brought into contact with the bottom end surface 30b. Thus, the caulking agent is cured around and between the bottom plate 31 and the frame body 30, and a caulking layer adhering them to each other is formed. The bottom plate 31 and the frame body 30 are adhered and fixed to each other with this caulking layer.

A projection 30c is formed on the bottom end surface 30b of the frame body 30, and a cutout portion 31c is formed at a position, in the bottom plate 31, corresponding to the projection 30c. The projection 30c and the cutout portion 31c perform positioning between the frame body 30 and the bottom plate 31. The projection 30c and the cutout portion 31c are formed in left-right asymmetry so as to be fitted only when the direction of the frame body 30 and the direction of the bottom plate 31 are in the correct relationship. Thus, the projection 30c and the cutout portion 31c guide the frame body 30 and the bottom plate 31 so as to be combined in correct directions. Although only one projection 30c and one cutout portion 31c are shown in FIG. 4, a plurality of projections 30c and corresponding cutout portions 31c are provided.

The housing 11 obtained in step S2 is mounted and fixed to the transport jig 35 for transporting the housing 11 in a horizontally laid state (step S3).

Figure 5:
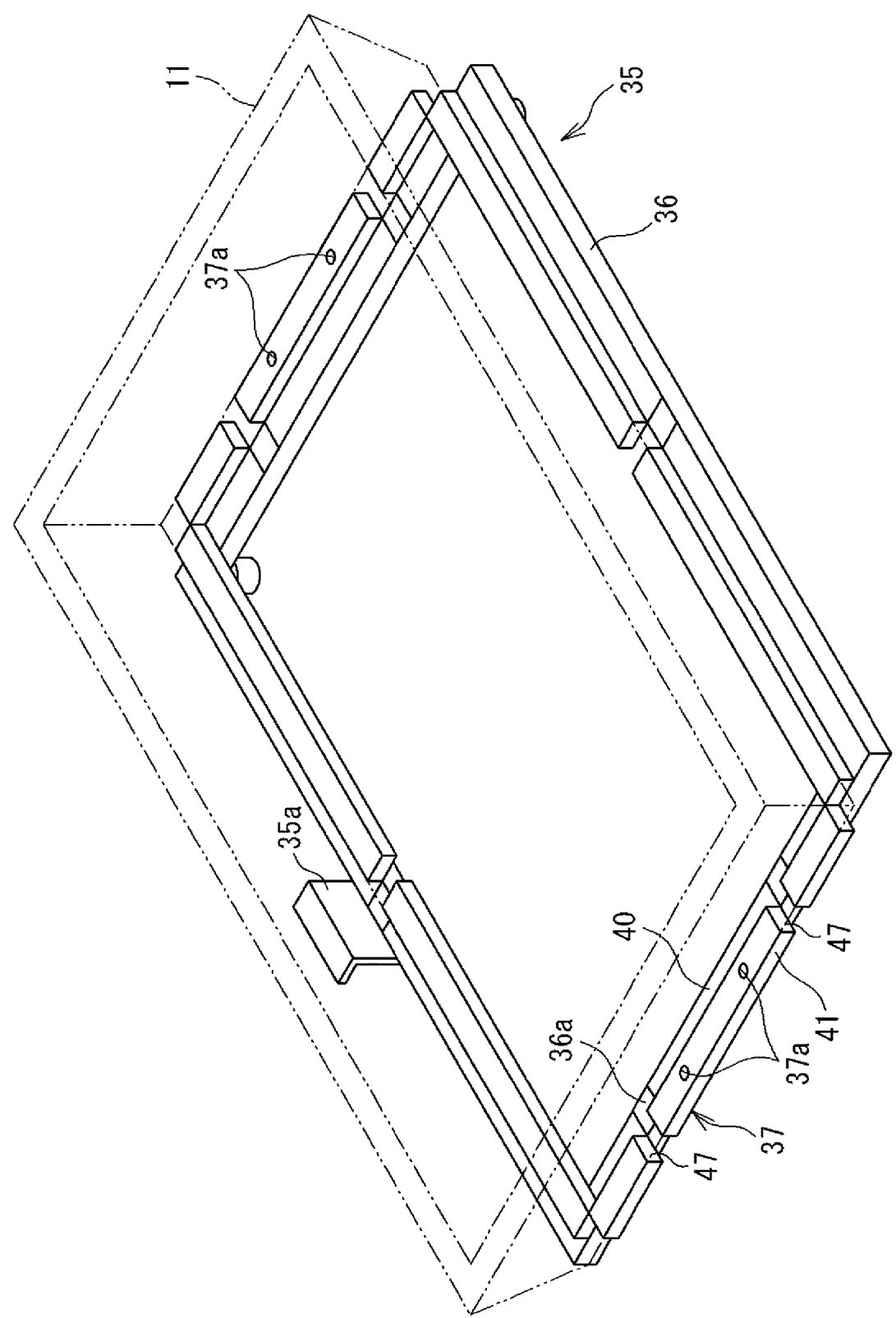
FIG. 5 is a perspective view showing the transport jig.

FIG. 5 is a perspective view showing the transport jig 35. With reference to FIG. 5 and FIG. 4, the housing 11 is mounted in the horizontally laid state on the upper side of the transport jig 35, and the transport jig 35 transports the housing 11.

The transport jig 35 includes a rectangular frame 36 (body part), a support portion 37 provided on an upper surface 36a of the frame 36, and a plurality of ball rollers 38 provided on a lower surface 36b of the frame 36.

The frame 36 is formed in a frame shape by, for example, assembling bar members, each having a C-shaped cross section and formed from an aluminum alloy, in a rectangular shape. A short side dimension of the frame 36 is a little larger than a short side dimension of the frame body 30, and a long side dimension of the frame 36 is a little smaller than a long side dimension of the frame body 30.

The frame 36 is further provided with a handle 35a for handling the transport jig 35 to which the housing 11 is fixed.

The support portion 37 is provided over almost the entire periphery of the frame 36, and supports the housing 11 from below. The support portion 37 includes a bracket 40 fixed to the upper surface 36a of the frame 36, and a pad 41 that is fixed to the upper surface of the bracket 40 and is in contact with the bottom plate 31 of the housing 11.

The bracket 40 is a plate-shaped member formed from an aluminum alloy. A part, of the bracket 40, formed on each short side of the frame 36 extends along the short side and protrudes outward with respect to the outer surface of the frame 36. A part, of the bracket 40, formed on each long side of the frame 36 extends along the long side and protrudes inward with respect to the inner surface of the frame 36.

The pad 41 is a member formed from resin, and is fixed to the upper surface of an end portion of the bracket 40. Therefore, a part, of the pad 41, formed on each short side of the frame 36 is disposed outward with respect to the outer surface of the frame 36. Meanwhile, a part, of the pad 41, formed on each long side of the frame 36 is disposed inward with respect to the inner surface of the frame 36.

The housing 11 is fixed to the transport jig 35 with the bottom plate 31 of the housing 11 being in contact with the upper surface of the pad 41.

Since the pad 41 is formed from resin, the bottom plate 31 is prevented from being damaged by the pad 41 when the pad 41 comes into contact with the bottom plate 31.

When the transport jig 35 is placed on a floor surface, the plurality of ball rollers 38 come into contact with the floor surface and allow the transport jig 35 to travel freely. This facilitates transportation of the housing 11 fixed to the transport jig 35.

In step S3, first, the pad 41 of the support portion 37 is brought into contact with the bottom plate 31 of the housing 11.

The pad 41 of the support portion 37 is provided so as to correspond to the bottom end surface 30b of the frame body 30. That is, the pad 41 is formed along almost the entire periphery of the bottom end surface 30b of the frame body 30.

Therefore, when the pad 41 of the support portion 37 is brought into contact with the bottom plate 31 of the housing 11, the pad 41 comes into contact with almost the entire periphery of the edge of the outer surface 31b of the bottom plate 31.

Figure 6:
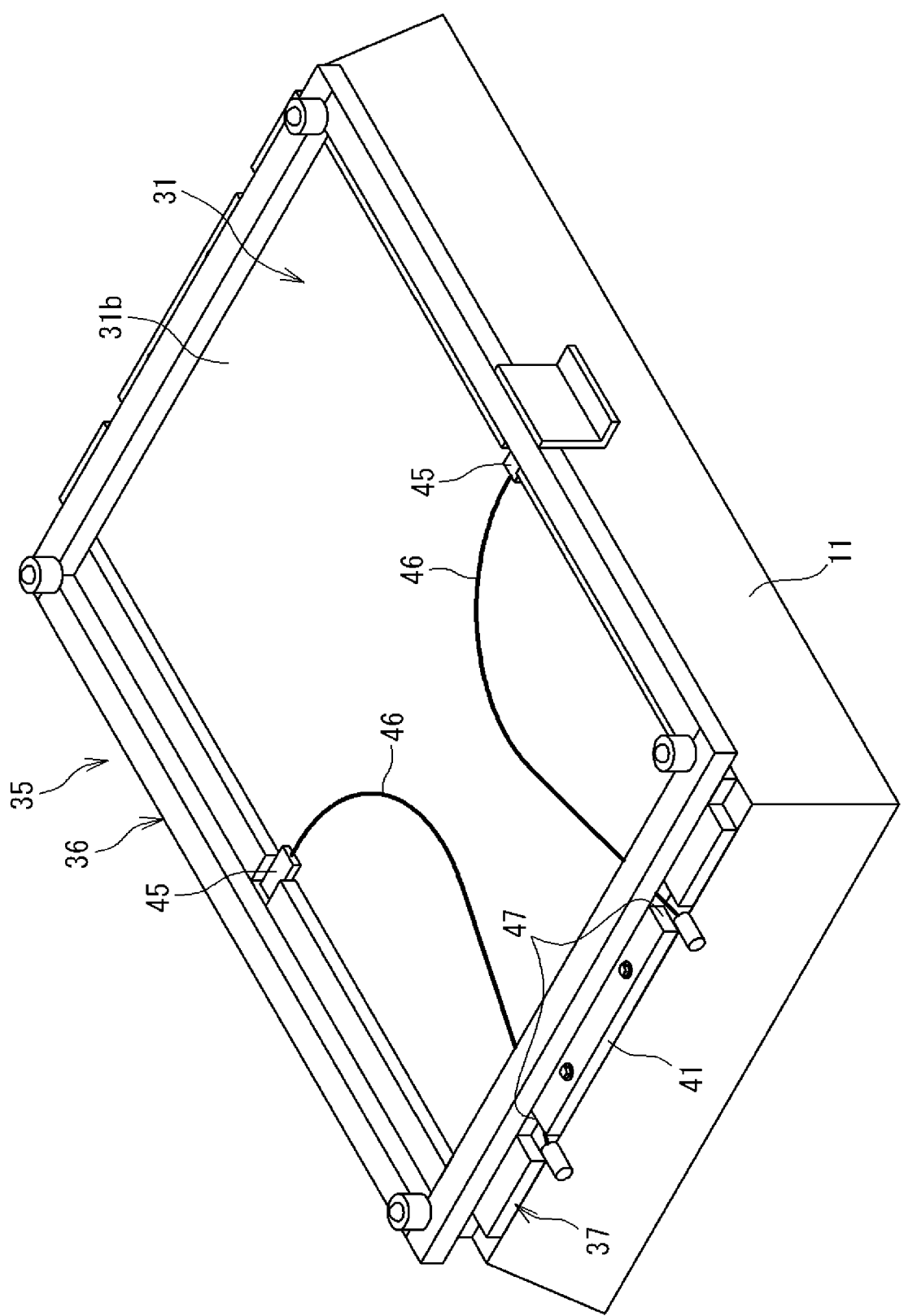
FIG. 6 shows a state in which a pad of a support portion is in contact with a bottom plate of a housing.

FIG. 6 shows a state in which the pad 41 of the support portion 37 is in contact with the bottom plate 31 of the housing 11.

A pair of combiner boxes 45 and output cables 46 extending from the respective combiner boxes 45 are provided on the outer surface 31b of the bottom plate 31. The output cables 46 are cables (output codes) for extracting power outputted from the plurality of cells disposed on the inner surface 31a.

A part, of the support portion 37, provided on each short side of the frame 36 has gaps 47 for releasing the output cables 46 to the outside of the support portion 37.

Therefore, when the pad 41 of the support portion 37 is brought into contact with the bottom plate 31 of the housing 11, the tips of the output cables 46 are released to the outside through the gaps 47.

Thus, in the subsequent work process, output inspection for the photovoltaic module 1M can be performed with the housing 11 being fixed to the transport jig 35.

Next, fixing members 50 are mounted to fix the housing 11 to the transport jig 35.

Each fixing member 50 is a tapping screw, for example. Two fixing members 50 are mounted to the part, of the support portion 37, on each short side of the frame 36.

Figure 7:
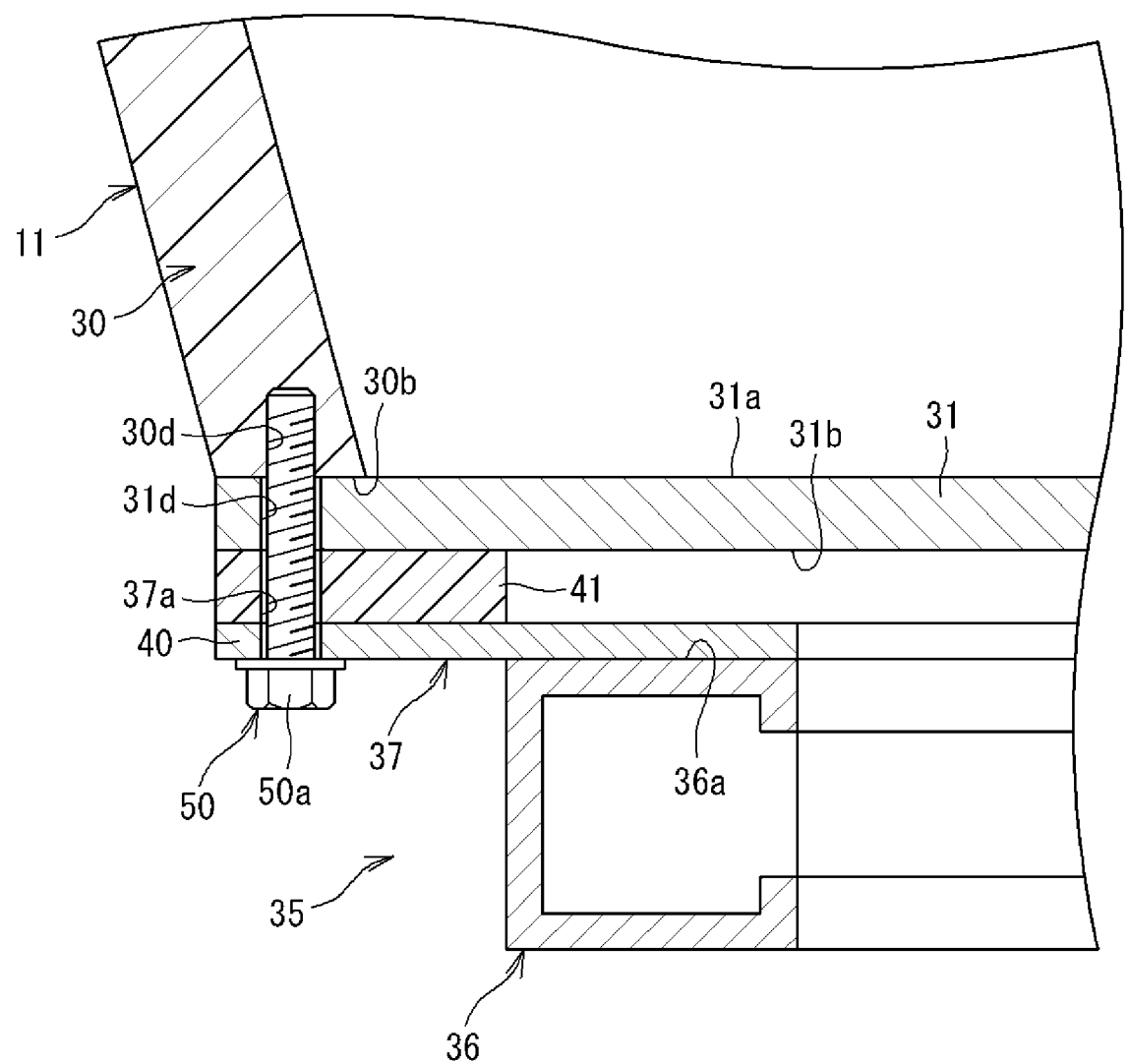
FIG. 7 is a partial cross-sectional view of the transport jig to which a fixing member is fixed.

FIG. 7 is a partial cross-sectional view of the transport jig 35 to which the fixing member 50 is fixed, showing a part where the fixing member 50 is mounted.

As shown in FIG. 7, a hole 30d into which the fixing member 50 is screwed is formed at the bottom end surface 30b of the frame body 30. In the present embodiment, since the frame body 30 is made from resin, if a hole having a diameter that allows the fixing member 50 to be screwed therein is formed, the fixing member 50 can be screwed into the hole.

The support portion 37 and the bottom plate 31 have a through-hole 37a and a through-hole 31d, respectively, at a position corresponding to the hole 30d of the frame body 30.

The fixing member 50 is inserted into the through-hole 37a of the support portion 37 and the through-hole 31d of the bottom plate 31 and is screwed and fastened into the hole 30d formed at the bottom end surface 30b of the frame body 30.

The fixing member 50 being screwed into the hole 30d allows relative positioning between the housing 11 and the transport jig 35.

Since the fixing member 50 is screwed and fastened into the hole 30d, the support portion 37 and the bottom plate 31 are held between a head 50a of the fixing member 50 and the bottom end surface 30b of the frame body 30.

Thus, the fixing member 50 presses the pad 41 of the support portion 37 toward the peripheral edge of the outer surface 31b of the bottom plate 31.

In this way, the fixing member 50 fixes the housing 11 to the transport jig 35 while the support portion 37 and the bottom plate 31 are held between the fixing member 50 and the bottom end surface 30b of the frame body 30.

In this case, the fixing member 50 presses the pad 41 toward the peripheral edge of the outer surface 31b of the bottom plate 31 while preventing the bottom plate 31 and the frame body 30 from being relatively displaced, whereby the peripheral edge of the inner surface 31a of the bottom plate 31 can be closely adhered to the bottom end surface 30b of the frame body 30. As a result, the bottom plate 31 and the frame body 30 can be appropriately adhered to each other.

Since the fixing member 50 prevents relative displacement between the bottom plate 31 and the frame body 30, even when adhesion between the bottom plate 31 and the frame body 30 is not completely finished because the caulking agent between the bottom plate 31 and the frame body 30 is not yet dried, the housing 11 can be transported to be advanced to the next work process.

In the present embodiment, the fixing member 50 is a tapping screw, and the frame body 30 is made from resin. Therefore, if the hole 30d is formed in the frame body 30, the fixing member 50 can be screwed into the hole 30d. Thus, the housing 11 can be easily fixed to the transport jig 35 without the necessity of, for example, embedding a nut or the like in the frame body 30 or forming a screw in the frame body 30.

Since the fixing member 50 can be screwed into the hole 30d from the outside of the housing 11, fixing and removal of the housing 11 with respect to the transport jig 35 are facilitated.

The transport jig 35 and the fixing member 50 removed from the housing 11 are reusable.

Referring back to FIG. 3, the housing 11 fixed to the transport jig 35 in step S3 is transported to the next step.

The housing 11 fixed to the transport jig 35 proceeds to the next step, i.e., an inspective step (step S4). In the inspection step, withstand voltage inspection for the plurality of cells and the like disposed on the inner surface 31a, airtightness inspection between the bottom plate 31 and the frame body 30, and the like are performed (step S4).

Thereafter, the housing 11 fixed to the transport jig 35 proceeds to a step of mounting the concentrating portion 12 (FIG. 2). In the step of mounting the concentrating portion 12, the concentrating portion 12 is mounted to the housing 11 (step S5). Thus, the photovoltaic module 1M is obtained.

Then, the housing 11 fixed to the transport jig 35 proceeds to an output inspection step (step S6), where an output inspection regarding the photovoltaic module 1M is performed.

Thereafter, the housing 11 fixed to the transport jig 35 proceeds to a transport jig removal step, where the housing 11 is removed from the transport jig 35 (step S7).

Thus, the photovoltaic module 1M is completed.

As described above, according to the assembling process (manufacturing method) for the photovoltaic module 1M of the present embodiment, since the housing 11 is fixed to the transport jig 35 while the support portion 37 provided so as to correspond to the bottom end surface 30b of the frame body 30 is in contact with the peripheral edge of the outer surface 31b of the bottom plate 31, the housing 11 can be supported (reinforced) by the transport jig 35 so as to prevent deflection of the resin frame body 30. Therefore, when the housing 11 fixed to the transport jig 35 is subjected to the subsequent work process, it is possible to suppress deflection that occurs in the housing 11 during assembling and transportation between process steps.

Since the transport jig 35 of the present embodiment is provided with the handle 35a for handling the transport jig 35, the transport jig 35 can be moved without directly touching the bottom plate 31 and the frame body 30 adhered to each other.

Since the transport jig 35 of the present embodiment is provided with the ball rollers 38 in contact with the floor surface, the transport jig 35 can be freely traveled. The transport jig 35 capable of traveling with the ball rollers 38 allows the frame 36 to be formed not by a bar member but by a plate member, whereby the degree of freedom in designing the transport jig 35 can be increased.

Other Embodiments

Figure 8:
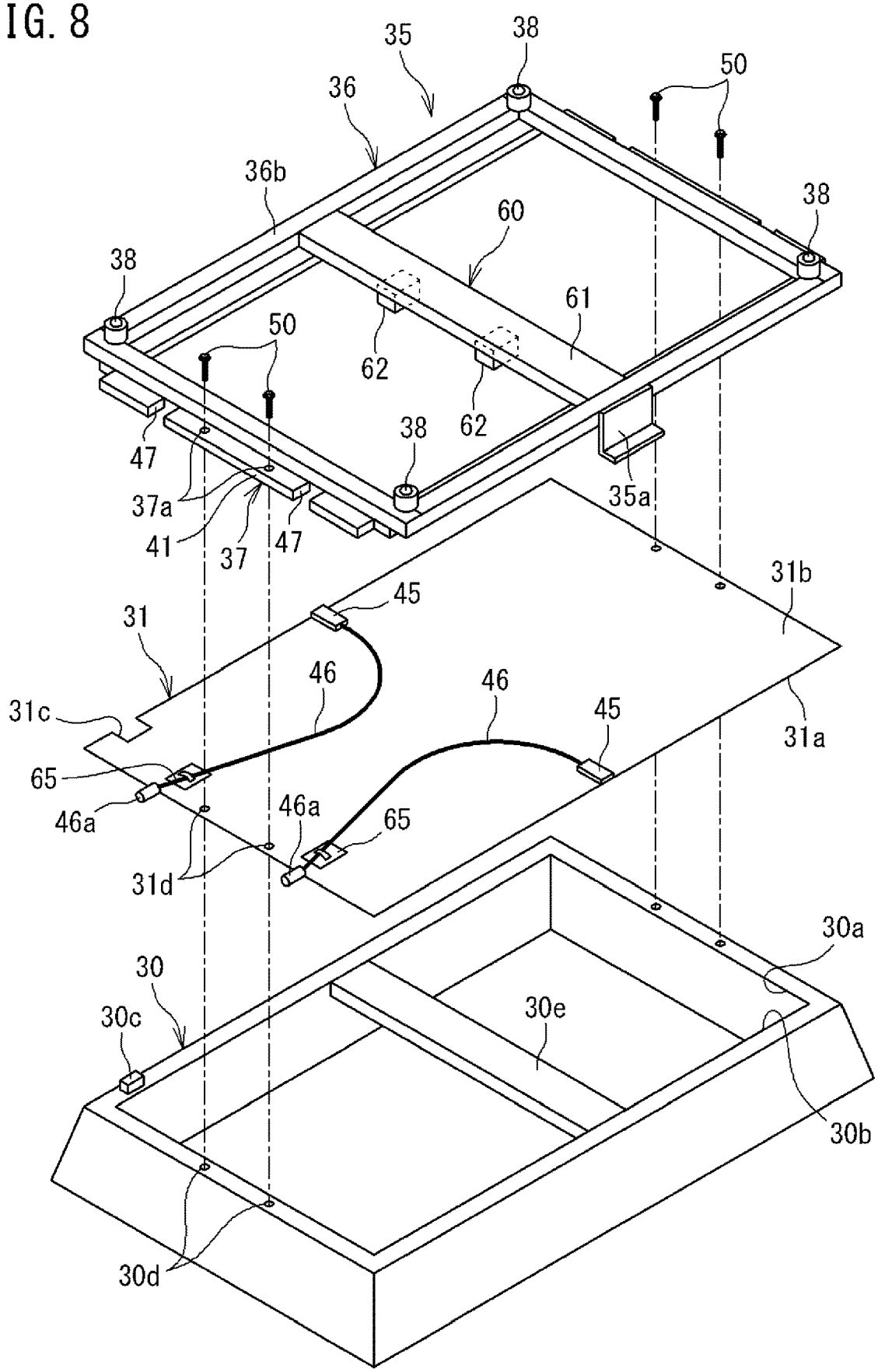
FIG. 8 is an exploded perspective view showing a frame body 30, a bottom plate 31, and a transport jig 35 according to another embodiment.

FIG. 8 is an exploded perspective view showing the frame body 30, the bottom plate 31, and the transport jig 35. The transport jig 35 is based on another embodiment of the present disclosure.

The transport jig 35 of this embodiment is provided with a holding member 60 for holding the bottom plate 31 so as not to deflect toward the transport jig 35.

The holding member 60 includes: an elongated holding plate 61 that crosses the inside of the rectangular frame 36 and connects the long sides of the frame 36; and protection pads 62 disposed between the holding plate 61 and the bottom plate 31.

While the housing 11 is fixed to the transport jig 35 and transported between process steps, the bottom plate 31 is held by the holding member 60 so as not to deflect downward. This improves workability when the bottom plate 31 is subjected to the respective steps in the work process.

If a column member 30e is disposed so as to cross the bottom-side opening 30a of the frame body 30, the bottom plate 31 can be held more reliably between the column member 30e and the holding member 60.

Furthermore, tips of output cables 46 are released to the outside through gaps 47. In this embodiment, clips 65 (code holders) for holding the output cables 46 on the outer surface 31b are disposed on the outer surface 31b of the bottom plate 31.

Figure 9:
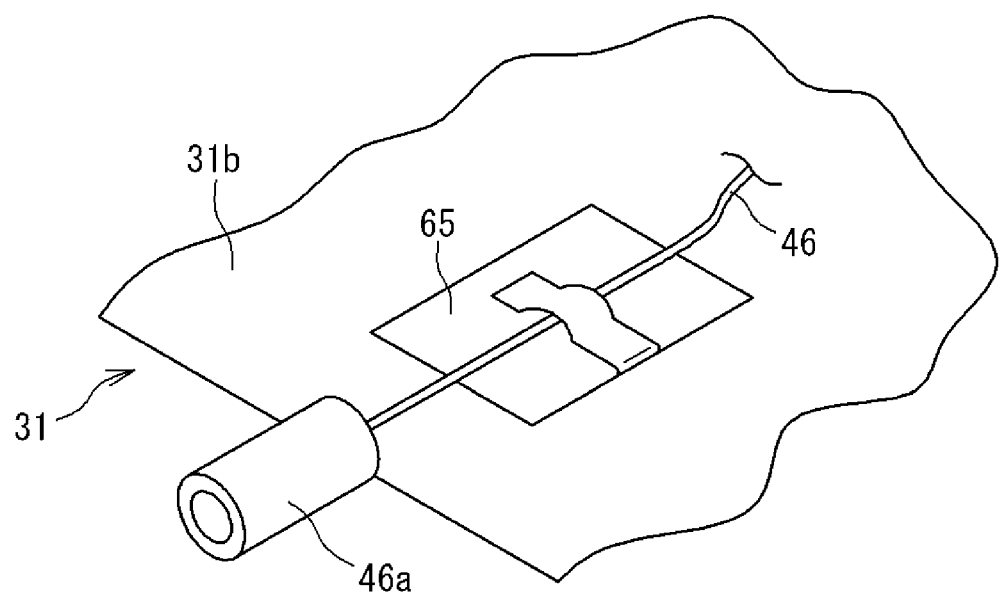
FIG. 9 is an enlarged perspective view of a clip 65.

FIG. 9 is an enlarged perspective view of the clip 65. As shown in FIG. 8 and FIG. 9, the clip 65 is disposed at a position corresponding to the gap 47, and holds the output cable 46 so that a connector 46a at the tip of the output cable 46 is exposed to the outside.

Thus, the connector 46a can be positioned with respect to the bottom plate 31 (housing 11).

Therefore, when the pad 41 of the support portion 37 is brought into contact with the bottom plate 31 of the housing 11, the connector 46a of each output cable 46 is released to the outside through the gap 47, and the output cable 46 is held by the clip 65 with the connector 46a being released to the outside through the gap 47. Thus, the housing 11 can be fixed to the transport jig 35.

Thus, the housing 11 is easily fixed to the transport jig 35 with the connector 46a of each output cable 46 being released to the outside through the gap 47.

Furthermore, when the output inspection is performed with the housing 11 being fixed to the transport jig 35, the connector 46a is positioned with respect to the housing 11, and therefore can be easily connected to an inspection device for the output inspection.

While a clip is used for holding the output cable 46 in the present embodiment, any means that can hold the output cable 46, such as a band that is fixed to the outer surface 31b and holds the output cable 46 in a removable manner, may be used.

Others

It should be noted that the embodiments disclosed herein are merely illustrative and not restrictive in all aspects.

In the above embodiments, the hole 30d is formed in the short-side portion of the frame body 30 at the bottom end surface 30b, and the short-side portion of the bottom end surface 30b is fixed to the transport jig 35 by use of the fixing member 50. However, the hole 30d may be formed in the long-side portion of the frame body 30, and the long-side portion of the bottom end surface 30b may be fixed to the transport jig 35 by use of the fixing member 50.

In the above embodiments, a tapping screw is used as the fixing member 50. However, the present disclosure is not limited thereto. For example, a general bolt can also be used as the fixing member 50 by embedding a nut in the frame body 30 or forming a screw in the frame body 30. However, using the tapping screw as in the present embodiment facilitates fixing of the housing 11 to the transport jig 35.

The scope of the present disclosure is defined by the scope of the claims rather than by the meaning described above, and is intended to include meaning equivalent to the scope of the claims and all modifications within the scope.

REFERENCE SIGNS LIST 1 array
1M photovoltaic module
2 support device
11 housing
12 concentrating portion
12a glass plate
12f condenser lens
13 flexible printed circuit
14 cell package
15 secondary lens
16 protection plate
17 shielding plate
17a opening
21 post
22 base
23 biaxial drive part
24 horizontal shaft
30 frame body
30a bottom-side opening
30b bottom end surface
30c projection
30d hole
30e column member
31 bottom plate
31a inner surface
31b outer surface
31c cutout portion
31d through-hole
35 transport jig
35a handle
36 frame
36a upper surface
36b lower surface
37 support portion
37a through-hole
38 ball roller
40 bracket
41 pad
45 combiner box
46 output cable
46a connector
47 gap
50 fixing member
50a head
60 holding member
61 holding plate
62 protection pad
65 clip
100 photovoltaic apparatus
R light receiving portion

The invention claimed is:

1. A transport jig configured to transport a housing for a concentrator photovoltaic module, the housing accommodating a plurality of power generating elements onto which sunlight is concentrated by a plurality of condenser lenses, the housing including a resin frame body, and a metal bottom plate that closes a bottom-side opening of the frame body and has an inner surface on which the plurality of power generating elements are disposed, and the bottom plate being fixed to the frame body, with a peripheral edge of the inner surface of the bottom plate being in contact with a bottom end surface of the frame body, the transport jig comprising:
a support portion configured to extend along a peripheral edge of an outer surface of the bottom plate and contact the peripheral edge of the outer surface;
a fixing member configured to be inserted into a through-hole of the support portion and a through-hole of the bottom plate and be screwed and fastened into a hole at the bottom end surface of the frame body;
a head of the fixing member configured to sandwich the support portion and the bottom plate between the head and the bottom end surface of the frame body;
a ball roller that is in contact with a floor surface where the transport jig is placed, and allows the transport jig to travel freely; and
a rectangular frame provided to the fixing member and the ball roller, the frame including:
a first long column member;
a second long column member;
a first short column member, one end of the first long column member and one end of the first short column member being connected to each other, the ball roller being provided at a joint between the one end of the first long column member and the one end of the first short column member and being provided across the one end of the first long column member and the one end of the first short column member; and
a second short column member.

2. The transport jig according to claim 1 further comprising:
a handle configured to handle the transport jig.

3. The transport jig according to claim 1, further comprising:
a bottom plate holding portion configured to cross an inside of the frame, and hold the bottom plate from below.

* * * * *